(12) United States Patent
Christenson et al.

(10) Patent No.: US 10,123,447 B2
(45) Date of Patent: *Nov. 6, 2018

(54) SLAM LATCH

(71) Applicant: International Business Machines Corporation, Armonk, NY (US)

(72) Inventors: Brandon R. Christenson, Stewartville, MN (US); Elias J. Rosedahl, Zumbrota, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/813,685

(22) Filed: Nov. 15, 2017

(65) Prior Publication Data

US 2018/0270983 A1    Sep. 20, 2018

Related U.S. Application Data

(63) Continuation of application No. 15/459,297, filed on Mar. 15, 2017, now Pat. No. 9,894,796.

(51) Int. Cl.
| | |
|---|---|
| *H05K 7/16* | (2006.01) |
| *A47F 7/00* | (2006.01) |
| *H05K 7/14* | (2006.01) |
| *F16B 2/18* | (2006.01) |

(52) U.S. Cl.
CPC .............. *H05K 7/1489* (2013.01); *F16B 2/18* (2013.01)

(58) Field of Classification Search
CPC ................................ H05K 7/1489; F16B 2/18
USPC .................................... 361/724–727; 211/26
See application file for complete search history.

(56) References Cited

U.S. PATENT DOCUMENTS

| | | | |
|---|---|---|---|
| 5,277,615 A | 1/1994 | Hastings et al. | |
| 7,318,532 B1 * | 1/2008 | Lee | H05K 7/1405 |
| | | | 211/26 |
| 7,515,429 B1 | 4/2009 | Schmidt et al. | |
| 7,604,308 B2 | 10/2009 | Tseng et al. | |

(Continued)

FOREIGN PATENT DOCUMENTS

| | | | | |
|---|---|---|---|---|
| DE | 102009038160 A1 * | 2/2010 | | H05K 7/1489 |
| DE | 102012105008 A1 | 12/2013 | | |

OTHER PUBLICATIONS

Christenson et al., "Slam Latch", U.S. Appl. No. 15/459,297, filed Mar. 15, 2017.

(Continued)

*Primary Examiner* — Nidhi Thaker
(74) *Attorney, Agent, or Firm* — Martin & Associates, LLC; Derek P. Martin

(57) ABSTRACT

A slam latch includes a retaining screw that is held in position by a distal upper support that constrains a distal portion of the retaining screw from moving upward, a middle lower support that constrains a middle portion of the retaining screw from moving downward, and a proximal upper support that constrains a proximal portion of the retaining screw from moving upward. The slam latch further comprises one or more L-shaped retaining members on the side that allow sliding the one or more L-shaped retaining members into a corresponding slot(s) of a device being secured, thereby preventing the slam latch from torquing and bending with respect to the device.

6 Claims, 8 Drawing Sheets

(56) References Cited

U.S. PATENT DOCUMENTS

| | | | | |
|---|---|---|---|---|
| 8,724,330 B1* | 5/2014 | Dittus | ............... | H05K 7/1489 |
| | | | | 361/726 |
| 8,978,245 B2* | 3/2015 | Dittus | ............... | H05K 7/1489 |
| | | | | 29/832 |
| 9,363,921 B1* | 6/2016 | Chen | ............... | H05K 7/1489 |
| 9,723,745 B2* | 8/2017 | Qi | ............... | H05K 7/1489 |
| 2009/0271950 A1* | 11/2009 | Wang | ............... | E05B 1/0015 |
| | | | | 16/415 |
| 2013/0241377 A1* | 9/2013 | Zhang | ............... | H05K 5/0221 |
| | | | | 312/223.2 |
| 2014/0265784 A1* | 9/2014 | Russell | ............... | H05K 7/1421 |
| | | | | 312/333 |

OTHER PUBLICATIONS

Christenson et al., "Slam Latch", U.S. Appl. No. 15/813,765, filed Nov. 15, 2017.

Appendix P—List of IBM Patents or Patent Applications Treated as Related, dated Dec. 1, 2017.

English Abstract of German Patent DE102012105008A1, Dec. 12, 2013.

\* cited by examiner

SLAM LATCH

BACKGROUND

1. Technical Field

This disclosure generally relates to closures, and more specifically relates to slam latches for server racks.

2. Background Art

Slam latches are used in many different applications. A slam latch is a type of latch that allows something such as a drawer or door to be slammed shut, and the process of slamming shut causes a catch to engage a retaining member, causing the drawer or door to remain shut. Slam latches are very well-known in the field of marine and recreational vehicles. Slam latches typically includes a tab or lever to release the latch when a person wants the closed drawer or door to open.

Slam latches are often used in racks of electronic equipment, such as server racks. Existing slam latches for server racks suffer from various disadvantages.

SUMMARY

A slam latch includes a retaining screw that is held in position by a distal upper support that constrains a distal portion of the retaining screw from moving upward, a middle lower support that constrains a middle portion of the retaining screw from moving downward, and a proximal upper support that constrains a proximal portion of the retaining screw from moving upward. The slam latch further comprises one or more L-shaped retaining members on the side that allow sliding the one or more L-shaped retaining members into a corresponding slot(s) of a device being secured, thereby preventing the slam latch from torquing and bending with respect to the device.

The foregoing and other features and advantages will be apparent from the following more particular description, as illustrated in the accompanying drawings.

BRIEF DESCRIPTION OF THE DRAWING(S)

The disclosure will be described in conjunction with the appended drawings, where like designations denote like elements, and:

DETAILED DESCRIPTION

The disclosure and claims herein relate to a slam latch that includes a retaining screw that is held in position by a distal upper support that constrains a distal portion of the retaining screw from moving upward, a middle lower support that constrains a middle portion of the retaining screw from moving downward, and a proximal upper support that constrains a proximal portion of the retaining screw from moving upward. The slam latch further comprises one or more L-shaped retaining members on the side that allow sliding the one or more L-shaped retaining members into a corresponding slot(s) of a device being secured, thereby preventing the slam latch from torquing and bending with respect to the device.

Figure 1:
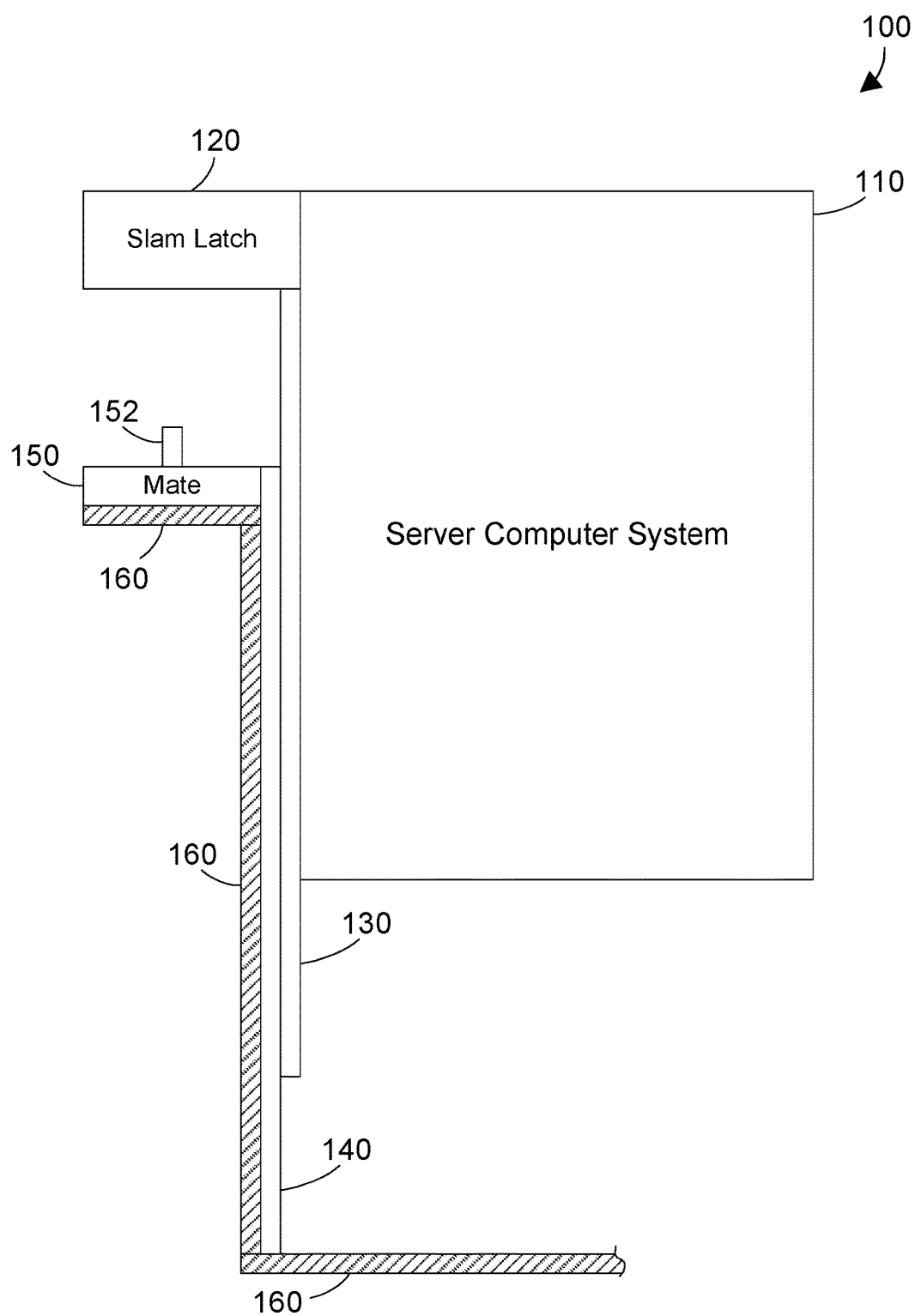
FIG. 1 is a top view of a portion of a server rack showing a server mounted to a slide rail that includes a slam latch, where the server is slid out from the server rack.
Figure 2:
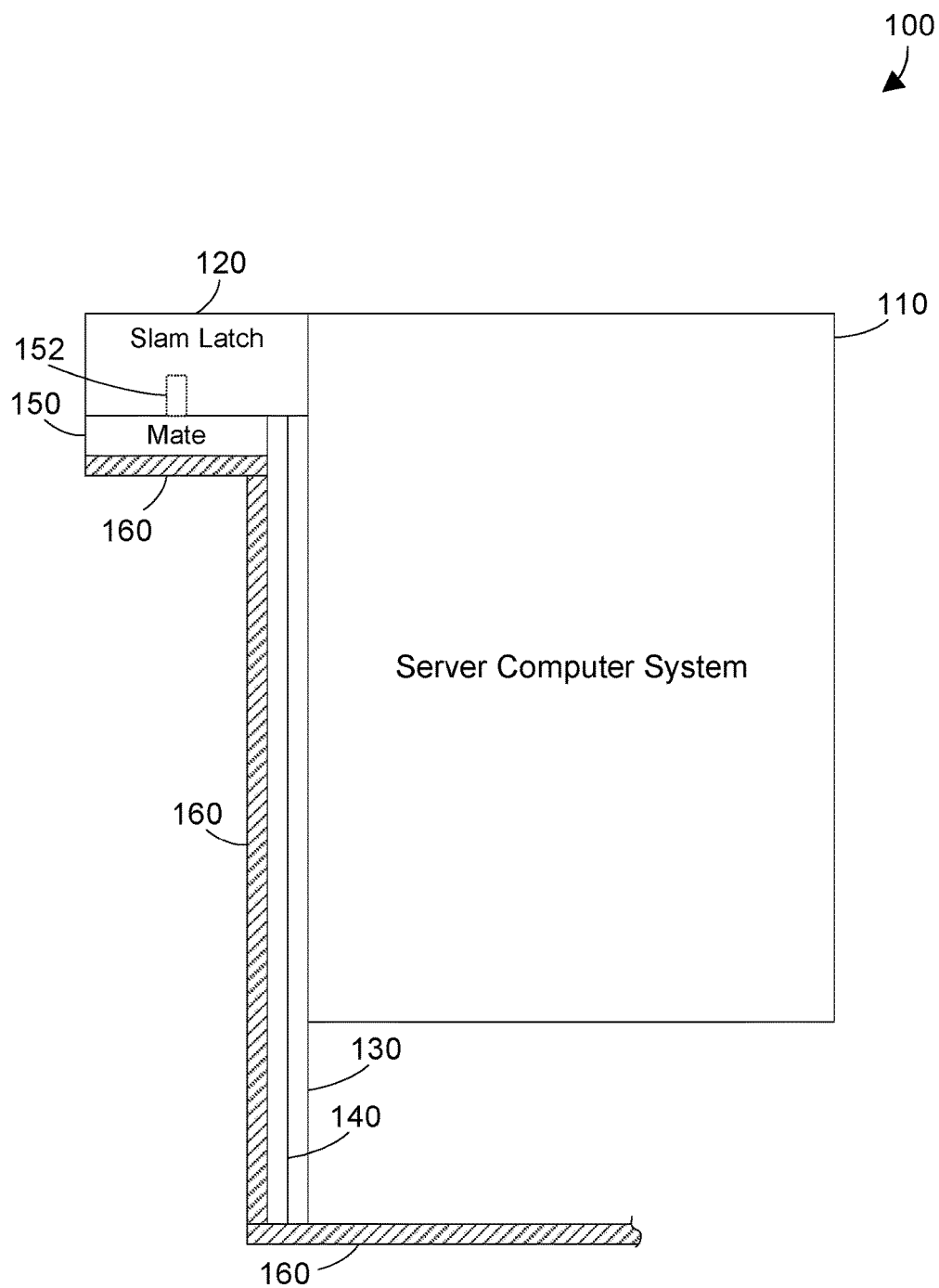
FIG. 2 is a top view of the server rack in FIG. 1 when the server is fully slid into the server rack, which causes the slam latch to engage the retaining member.

Referring to FIG. 1, a top view of part of a server rack is shown to illustrate the context of using slam latches on a server rack. In the example in FIG. 1, a server computer system 110 is attached to a slide rail 130 that slides with respect to a slide rail 140 mounted to the rack 160. A slam latch 120 is provided at the front of the slide rail 130, and a mating portion 150 with a retaining member 152 is attached to the rack 160 such that when the server computer system is slid into the rack, as shown in FIG. 2, the retaining member 152 is engaged by a catch in the slam latch 120, thereby keeping the server computer system in place in the rack. The use of existing slam latches on computer server racks is well-known in the art.

Figure 3:
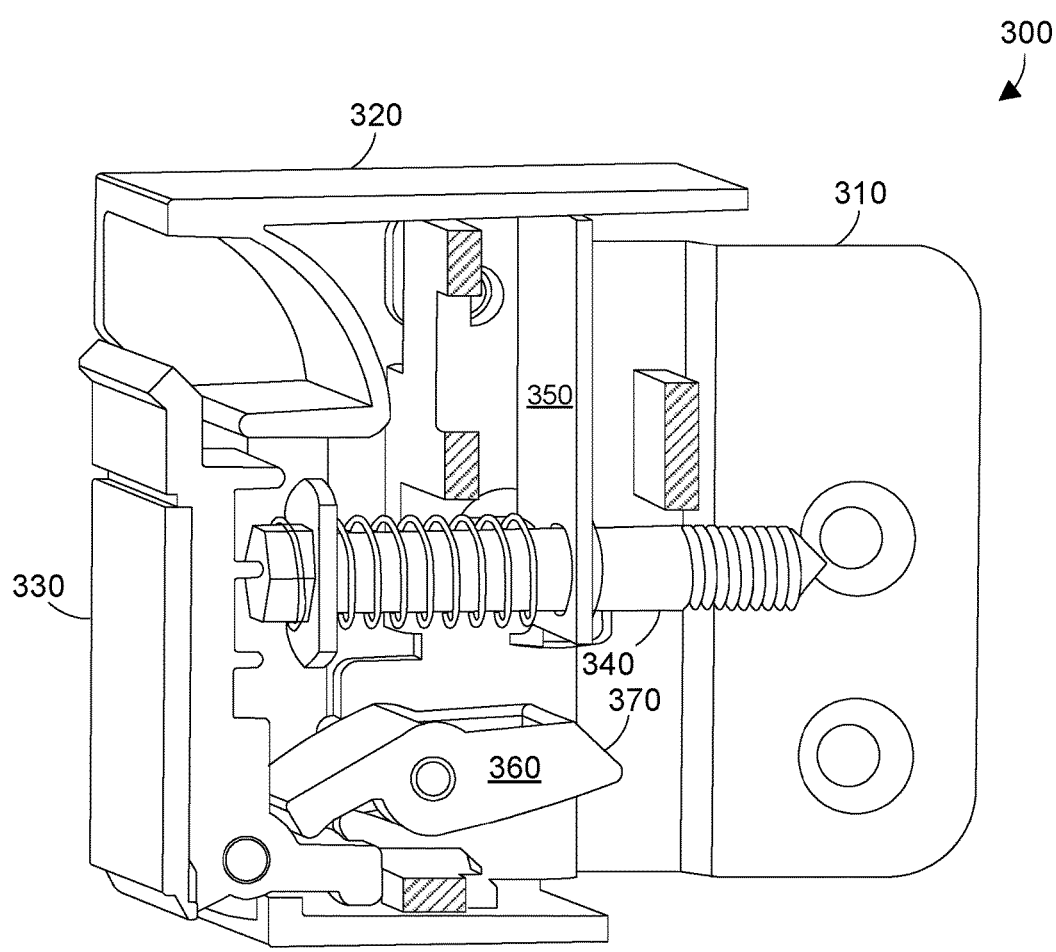
FIG. 3 is a perspective partial cutaway view showing internal components in a known slam latch.

FIG. 3 is a perspective cutaway view of the internal structure of a known slam latch, such as those used on x-series racks sold by IBM Corporation. The slam latch 300 includes a metal frame 310 with holes that allow the slam latch to be attached to the chassis of a server computer system. A catch 360 is biased by a spring in the counterclockwise direction as shown in FIG. 3. The spring for catch 360 is not shown for the sake of simplicity in the drawing. The rear portion of catch 360 has a beveled face 370 which allows a hook-shaped retaining member to push the beveled face 370, thereby rotating the catch 360 in a clockwise direction until the hook passes the catch 360, at which time the catch 360 rotates under force of the spring in a counterclockwise direction so the catch 360 engages the hook-shaped retaining member. A middle support 350 encircles and supports a retaining screw 340 so the retaining screw 340 is in a proper position. A front portion 320 includes a front lever 330 that can be rotated from the top downwards, causing the catch 360 to rotate in a clockwise direction, thereby disengaging the catch 360 from the hook-shaped retaining member. Once the slam latch 300 is in place with the catch 360 engaged on the hook-shaped retaining member, the retaining screw 340 may be screwed in, which causes the screw 340 to engage a threaded portion of the server rack, thereby more securely and more permanently fastening the server in place.

Figure 4:
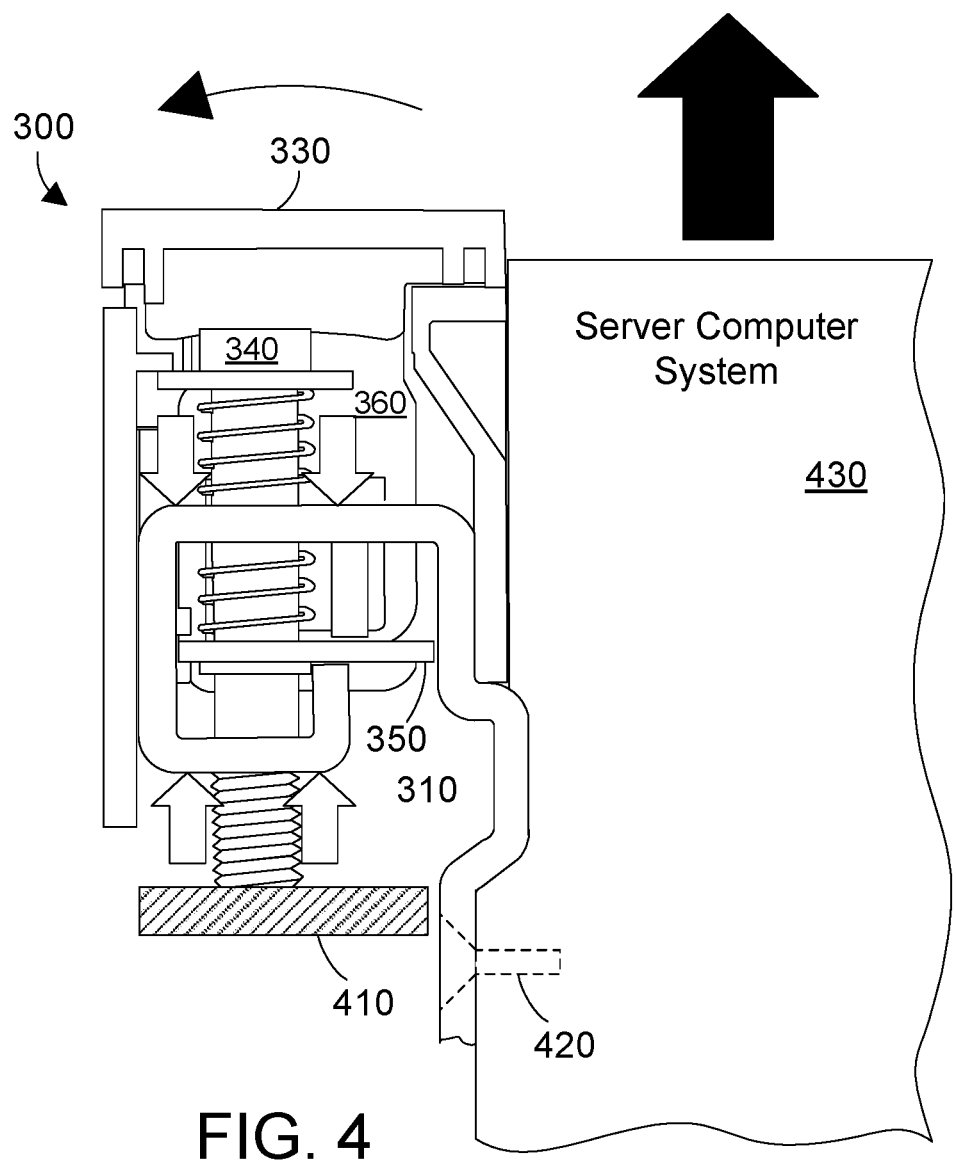
FIG. 4 is a top view of the known slam latch shown in FIG. 3.

FIG. 4 shows a cutaway top view of the slam latch 300 shown in FIG. 3. The metal frame 310 attaches to a server computer system 430 using one or more screws 420 as shown. The retaining screw 340 is screwed into the rack 410 until the head of the retaining screw 340 contacts the metal frame 310 as shown by the downward white arrows in FIG. 4. When the head of the retaining screw 340 contacts the metal frame 310 at the location designated by the downward-facing white arrows in FIG. 4, the rack 410 also contacts the metal frame 310 at the location designated by the upward-facing white arrows in FIG. 4. Because the metal frame 310 has the configuration shown in FIG. 4, tightening the retaining screw 340 can cause deformation of the metal frame 310 due to the metal frame bending in the direction shown by the opposing white arrows in FIG. 4. In addition, because the slam latch 300 attaches to the server computer system 430 using screws 420 as shown in FIG. 4, if a person pulls on the server computer system 430 without disengaging the slam latch 300, the slam latch 300 will torque due to the force in a direction indicated by the arrow above the slam latch 300. This can cause a gap between the front of the server computer system 430 and the front of the slam latch 300, and the angle between the two can cause the catch 360 of the slam latch 300 to disengage from the hook-shaped retaining member. In addition, because the middle support 350 completely surrounds the retaining screw 340, as shown in FIG. 3, the assembly of the slam latch 300 requires many steps. The slam latch disclosed and claimed herein overcomes many of these disadvantages in the known slam latch 300 shown in FIGS. 3 and 4.

Figure 5:
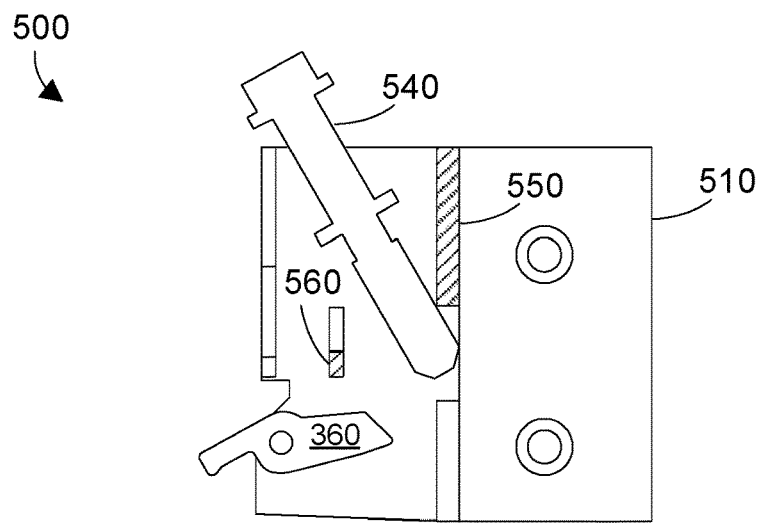
FIG. 5 is cutaway side view showing movement of a retaining screw during installation of the retaining screw in a slam latch as disclosed and claimed herein.
Figure 6:
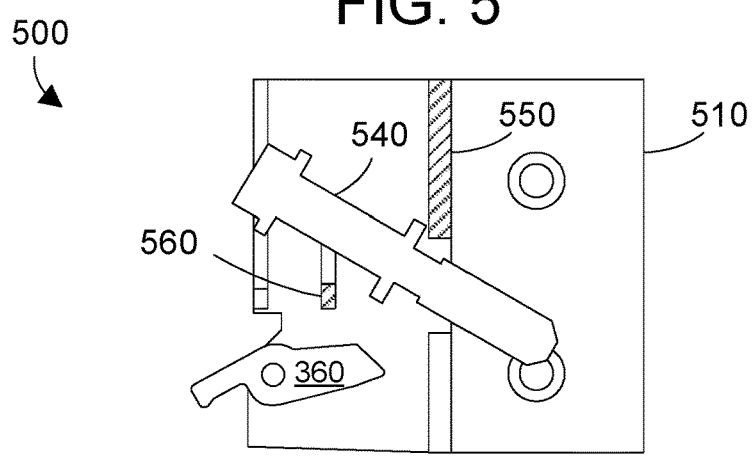
FIG. 6 is a cutaway side view showing continued movement of a retaining screw during installation of the retaining screw in a slam latch as disclosed and claimed herein.
Figure 7:
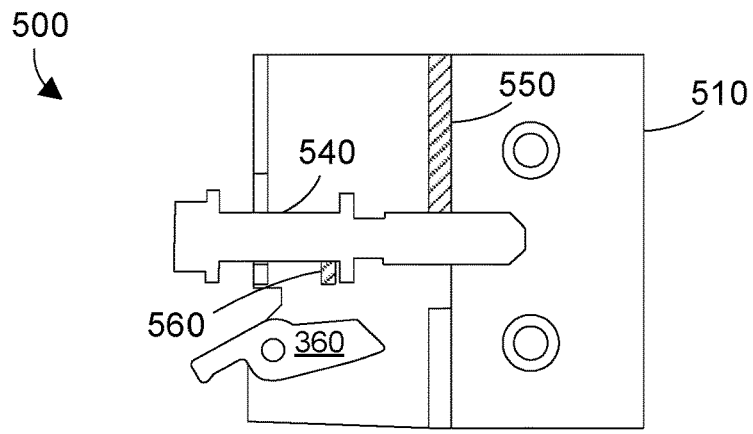
FIG. 7 is a cutaway side view showing continued movement of a retaining screw during installation of the retaining screw in a slam latch as disclosed and claimed herein.
Figure 8:
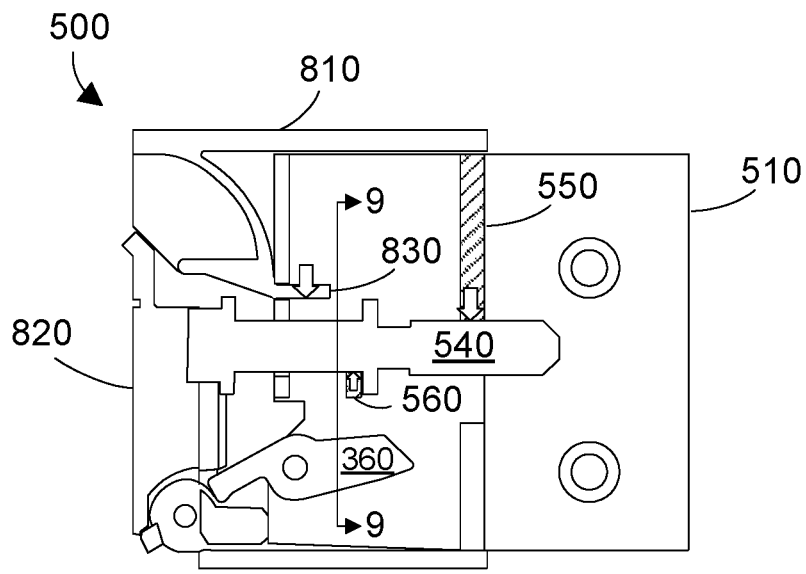
FIG. 8 is a cutaway side view of the slam latch in FIG. 7 after the front portion has been installed.

Referring to FIGS. 5-7, parts of a slam latch 500 according to the disclosure and claims are shown to illustrate assembly of retaining screw 540 into the slam latch 500. Instead of being captivated by a middle support 350 as shown in FIG. 3, the retaining screw 540 is geometrically constrained by different features in the slam latch 800. The slam latch 500 includes a metal frame 510, a distal upper support 550, and a middle lower support 560. The retaining screw 540 is first placed in the position shown in FIG. 5, with the distal end placed under the distal upper support 550. The retaining screw is then rotated, as shown in FIG. 6, and rotation continues until the retaining screw 540 is in the position shown in FIG. 7. Once in the position shown in FIG. 7, the retaining screw 540 is held in position by the distal upper support 550 and the middle lower support 560. Note the retaining screw 540 will have a spring attached, similar to retaining screw 340 shown in FIGS. 3 and 4, but the spring is not shown in FIGS. 5-7 for the sake of simplifying the drawings. Once the retaining screw is in the position shown in FIG. 7, the front of the slam latch may be attached, as shown in FIG. 8. The front portion 810 is attached to the metal frame 510. Note the front portion 810 includes a proximal upper support 830 that serves to retain the retaining screw 540 on its proximal end. Thus, once the slam latch 500 is fully assembled as shown in FIG. 8, the retaining screw 540 is retained in place by the distal upper support 550, the middle lower support 560, and the proximal upper support 830, as shown by the white arrows in FIG. 8. The retaining screw is therefore geometrically constrained by various features of the slam latch without having a separate piece, such as middle support 350 in FIG. 3, to hold the retaining screw in place. The result is a latch that is easier to manufacture than the prior art slam latch 300 shown in FIG. 3. Note the retaining screw 540 need not be in contact with the distal upper support 550, the middle lower support 560, and the proximal upper support 830. Instead, the retaining screw 540 may simply be in proximity to these supports without touching them, but may touch one or more of these supports before, while, or after the retaining screw 540 is screwed into a rack. Thus, retaining screw 540 has an upper distal portion in proximity to the distal upper support 830, that has a middle portion in proximity to the middle lower support 560, and that has a proximal portion in proximity to the proximal upper support 550.

Figure 9:
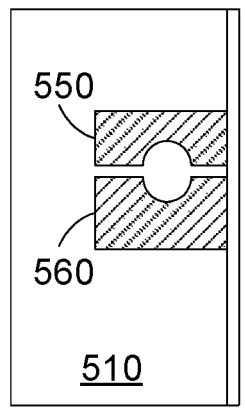
FIG. 9 is a view of a first configuration for some of the features in the slam latch 800 in FIG. 8 taken along the line 9-9.
Figure 10:
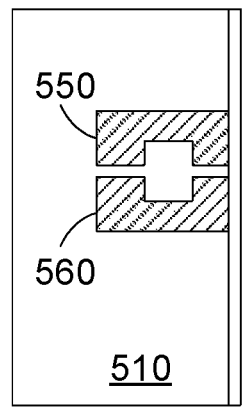
FIG. 10 is a view of a second configuration for some of the features in the slam latch 800 in FIG. 8 taken along the line 9-9.

Two partial views of the slam latch 500 in FIG. 8 taken along the line 9-9 are shown in FIGS. 9 and 10 to illustrate two possible configurations for the distal upper support 550 and the lower middle support 560 shown in FIG. 8. Referring to FIG. 9, the distal upper support 550 preferably includes an upper semi-circular recess facing down, and the middle lower support 560 preferably includes a lower semi-circular recess facing up, as shown. In an alternative configuration shown in FIG. 10, the distal upper support 550 has a rectangular recess facing down, and the middle lower support 560 has a rectangular recess facing up, as shown. Either of these configurations in FIGS. 9 and 10 could be used to retain the retaining screw in place. Of course, other configurations are also possible within the scope of the disclosure and claims herein. Note in the view in FIGS. 9 and 10 that middle lower support 560 is closer to the viewer than the end upper support 550, as shown in FIG. 8.

Figure 11:
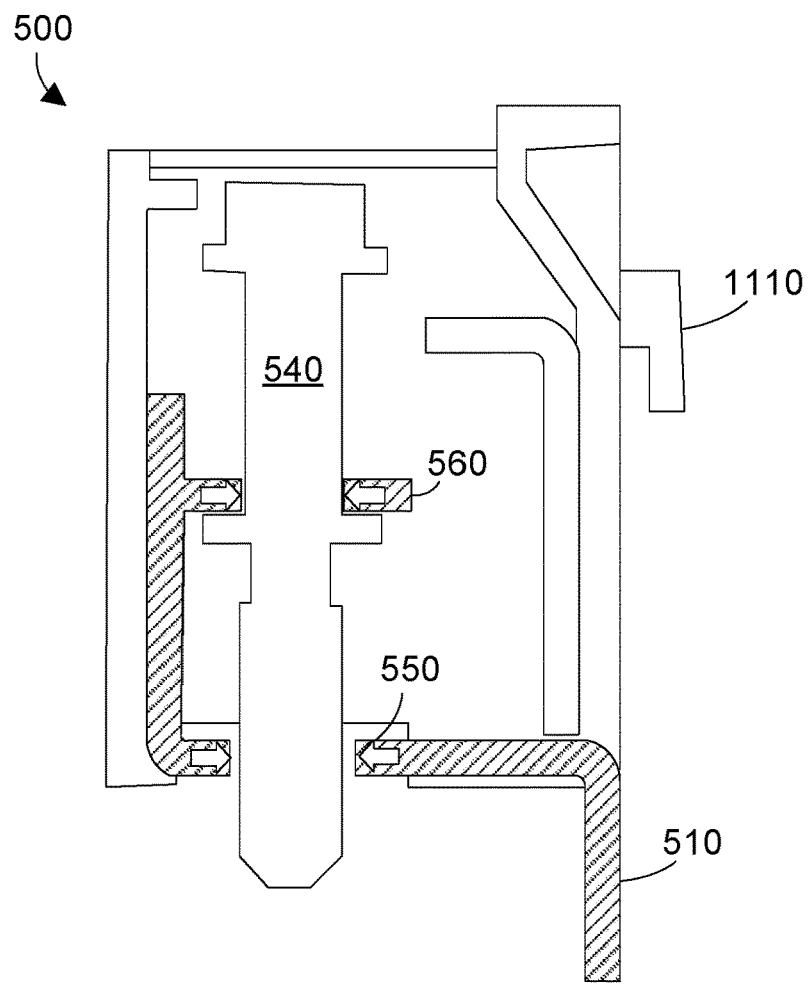
FIG. 11 is a cutaway top view of the slam latch 800 in FIG. 8.

Once the retaining screw 540 is installed as shown in FIG. 7, it is geometrically constrained by the sides of the distal upper support 550 and the middle lower support 560, as shown by the four white arrows in FIG. 11. The retaining screw 540 is thus retained in place by different geometric features of the slam latch 500, instead of being captivated in a single middle support 350 as shown in FIG. 3. This simplifies the manufacture and assembly of the slam latch 500.

Figure 12:
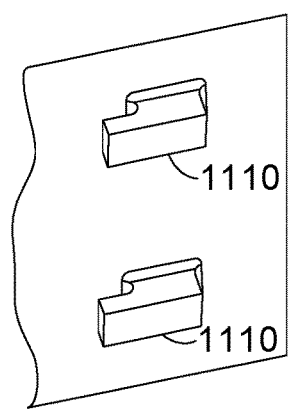
FIG. 12 is a side perspective view of the slam latch in FIG. 11 showing the L-shaped retaining members 1110.
Figure 13:
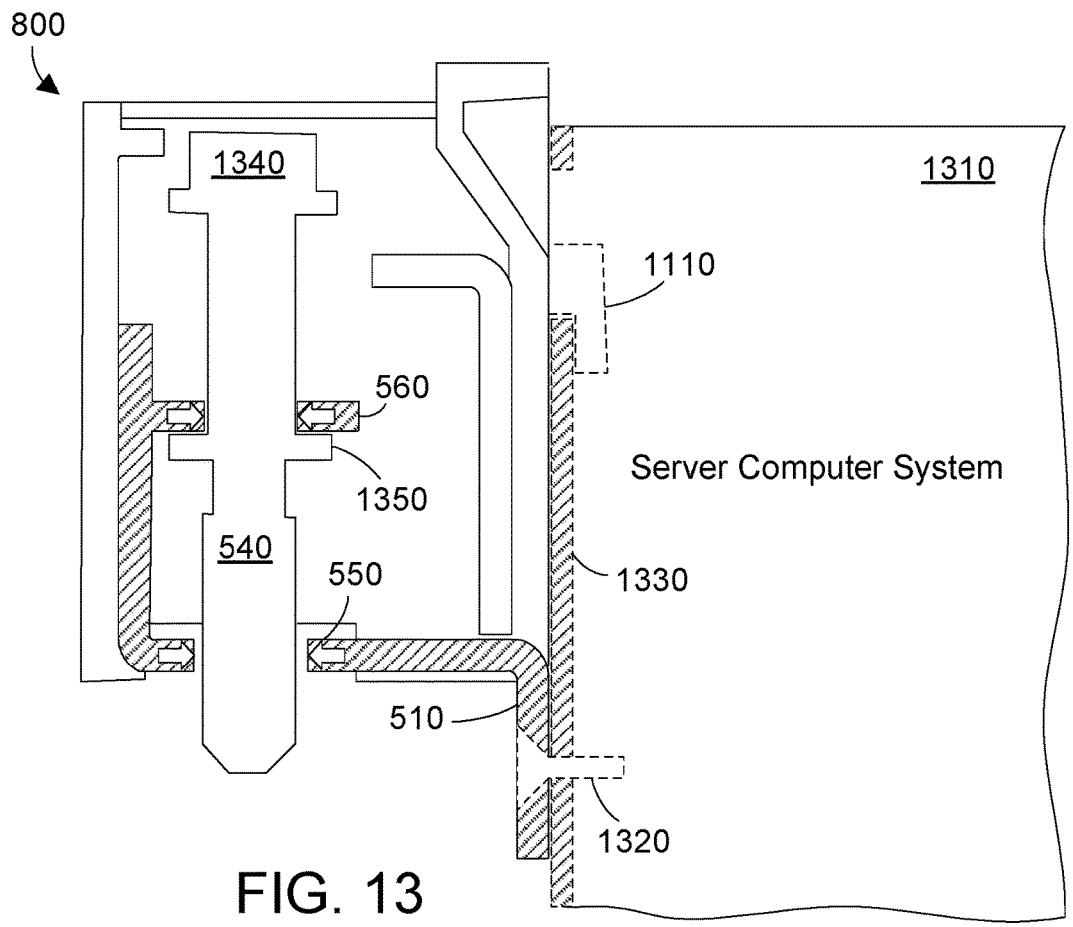
FIG. 13 is a cutaway top view of the slam latch 800 connected to an enclosure of a server computer system.

The top cutaway view in FIG. 11 shows another feature of the slam latch 500, namely, one or more L-shaped retaining members 1110 that are designed to engage corresponding slots on the chassis of electronic equipment, such as a server computer system. These L-shaped retaining members 1110 are shown in a perspective view in FIG. 12. FIG. 13 illustrates how the L-shaped retaining members 1110 help secure a server computer system 1310 in a way that the slam latch cannot be defeated by pulling on the server. As shown in FIG. 4, pulling the server an upward direction indicated by the big black arrow can cause the slam latch 300 to torque to the left, as shown by the arcing arrow above slam latch 300. This is because of the space between the front of the server computer system 430 and where the screws 420 attach the server computer system to the slam latch 300. In the configuration shown in FIG. 13, the slam latch 800 is connected to the server computer system 1310 by placing the L-shaped retaining members 1110 into recesses or slots in the side of the server computer system 1310, then moving the slam latch towards the rear of the server computer system so the L-shaped retaining member engages the side wall 1330 of the server computer system 1310, as shown in FIG. 13. Once the L-shaped retaining members 1110 are properly engaged into the side wall of the server computer system, the holes in the metal frame 510 will align with the threaded holes on the server computer system 1310, allowing the screws 1320 to be installed. The L-shaped retaining members 1110 provide another point of retention much closer to the front of the server computer system. If a person tries to pull on the server computer system 1310 without disengaging the slam latch 800, the force will not cause the slam latch 800 to torque sideways and disengage, as would happen with slam latch 300 in FIG. 3. The result is a slam latch that is easier to assemble and is more robust than known slam latches.

Another feature of the slam latch 800 shown in FIG. 13 is that retaining screw 540 includes a middle shoulder portion 1350. The middle shoulder portion 1350 is spaced from shoulder of the head portion 1340 such that when the middle shoulder portion 1350 tightens against the distal upper support 550, there is still a space between the shoulder on the head portion 1340 and the middle lower support 560. The result is the retaining screw 540 does not bend the metal frame within the slam latch 800 as it is tightened, as described above with reference to FIG. 4. The additional middle shoulder portion 1310 of retaining screw 540 thus provides a slam latch that is more rugged and provides for more certain attachment when the retaining screw is screwed into a rack.

A slam latch includes a retaining screw that is held in position by a distal upper support that constrains a distal portion of the retaining screw from moving upward, a middle lower support that constrains a middle portion of the retaining screw from moving downward, and a proximal upper support that constrains a proximal portion of the retaining screw from moving upward. The slam latch further comprises one or more L-shaped retaining members on the side that allow sliding the one or more L-shaped retaining members into a corresponding slot(s) of a device being secured, thereby preventing the slam latch from torquing and bending with respect to the device.

Note that terms have been used herein to describe the configuration of the slam latch, but these terms should not be construed as limiting. For example, the term "middle lower support" should not be construed to mean the support is at the exact middle of the retaining screw or at the exact middle of the slam latch. The middle lower support can constrain the retaining screw at any suitable location on the retaining screw. The proximal upper support means any support at any location proximal, or forward to, the middle lower support. Similarly, the distal upper support means any support at any location distal, or backward, of the middle lower support.

In the most preferred implementation, the frame 510 is made of metal and the front portion 810 is made of plastic. However, one skilled in the art will recognize that any suitable materials could be used.

While the slam latch discussed herein has particular application to server racks, one skilled in the art will recognize the slam latch could be used in many different applications other than server racks.

One skilled in the art will appreciate that many variations are possible within the scope of the claims. Thus, while the disclosure is particularly shown and described above, it will be understood by those skilled in the art that these and other changes in form and details may be made therein without departing from the spirit and scope of the claims.

The invention claimed is:

1. A latch comprising: a front portion comprising a proximal upper support; a frame attached to the front portion, the frame comprising: a distal upper support that comprises a first rectangular recess facing down; and a middle lower support forward of the distal upper support and backward of the proximal upper support, wherein the middle lower support comprises a second rectangular recess facing up; a retaining screw that has an upper distal portion in proximity to the distal upper support, that has a middle portion in proximity to the middle lower support, and that has a proximal portion in proximity to the proximal upper support; and a catch that is spring-biased in a counterclockwise direction and engages a retaining hook on a rack that supports a piece of equipment to hold the piece of equipment in the rack, wherein once the catch engages the retaining hook on the rack, the retaining screw may be screwed in to engage a threaded portion of the rack.

2. The latch of claim 1 further comprising a plurality of L-shaped retaining members on a side of the latch for engaging corresponding slots on the piece of equipment to which the latch is attached.

3. The latch of claim 2 wherein when the plurality of L-shaped retaining members engage the corresponding slots on the piece of equipment, at least one hole in the frame aligns with a threaded portion of a hole in the piece of equipment so the latch can be attached to the piece of equipment using one or more screws.

4. The latch of claim 1 wherein the retaining screw comprises a middle shoulder portion spaced from a head portion such that tightening the head portion against the middle lower support causes the middle shoulder portion to tighten against the distal upper support.

5. A latch comprising: a front portion comprising a proximal upper support; a frame attached to the front portion, the frame comprising: a distal upper support that comprises a first rectangular recess facing down; a middle lower support forward of the distal upper support and backward of the proximal upper support, wherein the middle lower support comprises a second rectangular recess facing up; a retaining screw that has an upper distal portion in proximity to the distal upper support, that has a middle portion in proximity to the middle lower support, and that has a proximal portion in proximity to the proximal upper support, wherein the retaining screw comprises a middle shoulder portion spaced from a head portion such that tightening the head portion against the middle lower support causes the middle shoulder portion to tighten against the distal upper support; a catch that engages a retaining hook on a rack that supports a piece of equipment to hold the piece of equipment in the rack; and a plurality of L-shaped retaining members on a side of the latch for engaging corresponding slots on the piece of equipment to which the latch is attached, wherein when the plurality of L-shaped retaining members engage the corresponding slots on the piece of equipment, at least one hole in the frame aligns with a threaded portion of a hole in the piece of equipment so the latch can be attached to the piece of equipment using one or more screws.

6. A server rack comprising: a first rail fixedly mounted to the server rack; a second rail slidably coupled to the first rail; a server computer system having a plurality of slots and a plurality of threaded holes on a side of the server computer system, the server computer system being connected to the second rail; a slam latch connected to the server computer system, the slam latch comprising: a front portion comprising a proximal upper support; a metal frame attached to the front portion, the metal frame comprising: a distal upper support that comprises a first rectangular recess facing down; and a middle lower support forward of the distal upper support and backward of the proximal upper support, wherein the middle lower support comprises a second rectangular recess facing up; a retaining screw that has an upper distal portion in proximity to the distal upper support, that has a middle portion in proximity to the middle lower support, and that has a proximal portion in proximity to the proximal upper support; a catch that engages a retaining hook on the server rack that supports the server computer system to hold the server computer system in the server rack;

and a plurality of L-shaped retaining members on a side of the slam latch for engaging the plurality of slots on the server computer system to which the slam latch is attached, wherein when the plurality of L-shaped retaining members engage the plurality of slots on the server computer system, at least one hole in the metal frame aligns with at least one of the threaded holes on the side of the server computer system so the slam latch can be attached to the server computer system using one or more screws.

* * * * *